(12) United States Patent
Sato

(10) Patent No.: US 10,128,318 B2
(45) Date of Patent: Nov. 13, 2018

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/807,762

(22) Filed: Nov. 9, 2017

(65) Prior Publication Data

US 2018/0069056 A1    Mar. 8, 2018

Related U.S. Application Data

(63) Continuation of application No. 15/236,761, filed on Aug. 15, 2016, now Pat. No. 9,842,887.

(30) Foreign Application Priority Data

Aug. 21, 2015    (JP) .................. 2015-163952

(51) Int. Cl.
| | |
|---|---|
| *H01L 27/32* | (2006.01) |
| *H01L 51/52* | (2006.01) |
| *H01L 51/50* | (2006.01) |

(52) U.S. Cl.
CPC ........ *H01L 27/3213* (2013.01); *H01L 27/326* (2013.01); *H01L 27/3276* (2013.01); *H01L 51/5012* (2013.01); *H01L 51/5209* (2013.01); *H01L 51/5225* (2013.01); *H01L 51/5275* (2013.01); *H01L 27/3218* (2013.01)

(58) Field of Classification Search
CPC ............. H01L 27/3213; H01L 27/3276; H01L 27/326; H01L 27/3218
See application file for complete search history.

(56) References Cited

U.S. PATENT DOCUMENTS

| | | |
|---|---|---|
| 2011/0147770 A1 | 6/2011 | Hwang et al. |
| 2011/0169720 A1 | 7/2011 | Hwang et al. |
| 2014/0145156 A1 | 5/2014 | Choi et al. |

FOREIGN PATENT DOCUMENTS

| | | |
|---|---|---|
| JP | 2000-091069 A | 3/2000 |
| JP | 2010-230797 A | 10/2010 |
| JP | 2011-142290 A | 7/2011 |

(Continued)

OTHER PUBLICATIONS

Taiwanese Office Action dated Mar. 23, 2017, for corresponding Taiwanese Patent Application No. 105121618.

(Continued)

*Primary Examiner* — Douglas Menz
(74) *Attorney, Agent, or Firm* — Typha IP LLC

(57) ABSTRACT

A display device includes a substrate having a plurality of transmissive regions aligned in a first direction and a second direction, a plurality of first wiring lines on the substrate extending in the first direction, a plurality of second wiring lines on the substrate extending in the second direction, and a plurality of light emitting sections disposed on the substrate. Each of the transmissive regions is surrounded by the first and second wiring lines. The light emitting sections include a first light emitting section and a second light emitting section. At least part of the first light emitting section is located in a region that is adjacent to the transmissive regions and overlap one of the first wiring lines. At least part of the second light emitting section is located in a region that is adjacent to the transmissive regions and overlap one of the second wiring lines.

6 Claims, 21 Drawing Sheets

(56) References Cited

FOREIGN PATENT DOCUMENTS

| | | |
|---|---|---|
| JP | 2013-84477 A | 5/2013 |
| JP | 2014-107268 A | 6/2014 |
| TW | I555181 B | 10/2016 |

OTHER PUBLICATIONS

Korean Office Action dated Dec. 22, 2016 for Korean Patent Application No. 10-2016-0104041.

DISPLAY DEVICE

CROSS-REFERENCE TO RELATED APPLICATIONS

This application is a continuation application of U.S. patent application Ser. No. 15/236,761 filed on Aug. 15, 2016, which claims priority from Japanese application JP2015-163952 filed on Aug. 21, 2015, the entire contents of which are hereby incorporated by reference into this application.

BACKGROUND OF THE INVENTION

1. Field of the Invention

The present invention relates to a display device.

2. Description of the Related Art

There is a known existing display that has pixels each including a light emitting region and light transmissive regions arranged adjacent to each other, causes the pixels to emit light to display an image, and transmits external light, and such a display is called a transparent display.

JP 2011-142290 A and JP 2014-107268 A each disclose an organic light emission display device in which a transmissive region is provided between two pixel regions each including a light emitting region.

In plan view of the transparent display, for example, in a case where the light emitting regions sandwich the transmissive region from both sides only in one direction, a phenomenon in which viewing angle characteristics is restricted and a phenomenon in which reflected external light is colored are likely to occur.

SUMMARY OF THE INVENTION

The invention has been made in view of the problems described above, and an object of the invention is to provide a technology for suppressing occurrence of the phenomenon in which viewing angle characteristics is restricted and the phenomenon in which reflected external light is colored.

Among aspects of the invention disclosed in the present application, an overview of representative aspects is briefly described as follows: A display device according to the invention includes a substrate having a plurality of transmissive regions aligned in a first direction and a second direction that intersects the first direction, a plurality of first wiring lines disposed on the substrate and extending in the first direction, a plurality of second wiring lines disposed on the substrate and extending in the second direction, and a plurality of light emitting sections disposed on the substrate. Each of the transmissive regions is surrounded by the first wiring lines and the second wiring lines. The plurality of light emitting sections include a first light emitting section and a second light emitting section. At least part of the first light emitting section is located in a region that is adjacent to the transmissive regions and overlap one of the first wiring lines. At least part of the second light emitting section is located in a region that is adjacent to the transmissive regions and overlap one of the second wiring lines.

Another display device according to the prevent invention includes a plurality of first wiring lines extending in a first direction, a plurality of second wiring lines extending in a second direction that intersects the first direction, transmissive regions surrounded by the plurality of first wiring lines and the plurality of second wiring lines, and first light emitting sections, second light emitting sections, third light emitting sections, and fourth light emitting sections that are arranged so as to separate from one another and each overlap at least one of the plurality of first wiring lines or the plurality of second wiring lines, and the transmissive regions are surrounded by the first light emitting sections, the second light emitting sections, the third light emitting sections, and the fourth light emitting sections.

According to the present invention, occurrence of the phenomenon in which viewing angle characteristics is restricted and the phenomenon in which reflected external light is colored can be suppressed.

DETAILED DESCRIPTION OF THE INVENTION

Figure 1:
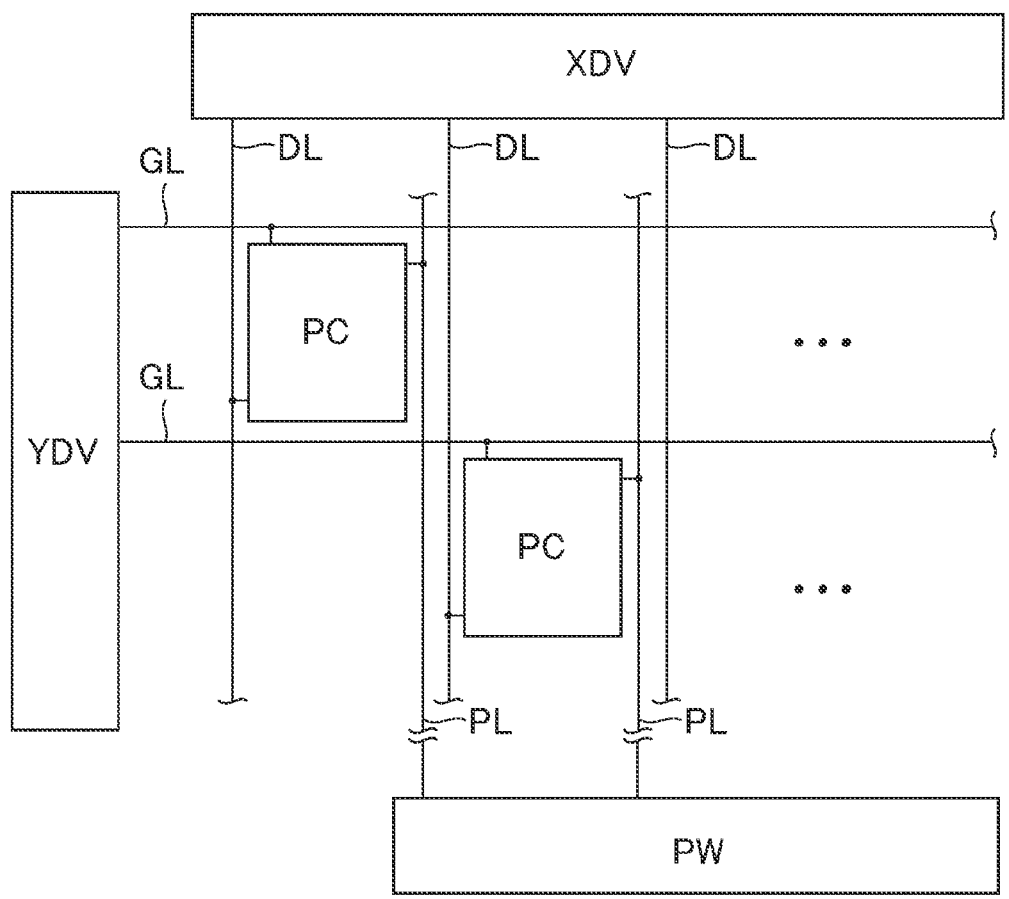
FIG. 1 is a circuit diagram for illustrating an example of an equivalent circuit of an organic EL display device according to a first embodiment.

Embodiments of the invention will be described below with reference to the drawings. Among components that appear in the embodiments, those having the same function have the same reference character, and no redundant description thereof will be made. The following description will be made of a case where the invention is applied to an organic EL display device, which is one type of display device, as the embodiments of the invention.

First Embodiment

An organic EL display device according to a first embodiment of the invention includes an array substrate SB (see FIG. 4), a flexible circuit substrate connected to the array substrate SB, and a driver integrated circuit. A plurality of light emitting elements LE (see FIG. 5), each of which emit light with one of colors such as RGB, are disposed on the array substrate SB, and full-color display is achieved by control of the luminance of the light from the light emitting elements LE. In the present embodiment, each of the light emitting elements LE is an OLED (organic light emitting diode) but may instead be a light emitting element of any other type. White OLEDs and color filters may be used to achieve the full-color display.

FIG. 1 is a circuit diagram showing an example of an equivalent circuit of the organic EL display device according to the first embodiment. Physically, the circuit shown in FIG. 1 is formed on the array substrate SB (see FIG. 4) and in the driver integrated circuit. A plurality of pixel circuits PC, a plurality of gate lines GL, a plurality of data lines DL, and a plurality of power lines PL are disposed on the array substrate SB. The plurality of pixel circuits PC are arranged in a matrix in a display region of the array substrate SB. Each of the pixel circuits PC corresponds to one unit pixel. One full-color pixel PX (see FIG. 2) contained in an image is expressed by a plurality of unit pixels that emit a plurality of color light. One gate line GL is provided per row of pixel circuits PC, and each of the gate lines GL is connected to the pixel circuits PC constituting the corresponding row. One data line DL is provided per column of pixel circuits PC, and each of the data lines DL is connected to the pixel circuits PC constituting the corresponding column. One end of each of the plurality of gate lines GL is connected to a drive circuit YDV, and one end of each of the plurality of data lines DL is connected to a drive circuit XDV. The drive circuit YDV outputs a scan signal to each of the gate lines GL, and the drive circuit XDV supplies each of the data lines DL with potential of an image signal according to a display gray level of a unit pixel. The image signal is inputted to the pixel circuit PC selected by the scan signal. The pixel circuits PC will be described later in detail.

Figure 2:
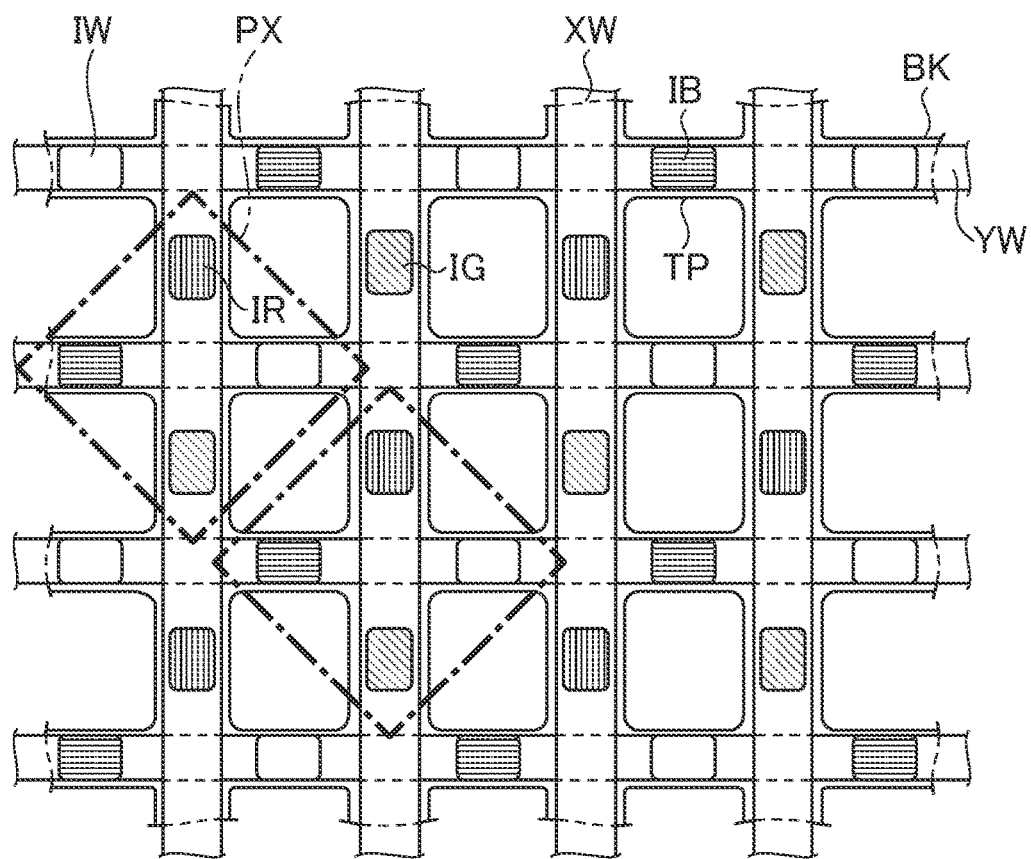
FIG. 2 is a diagram for illustrating an example of the arrangement of light emitting sections and transmissive regions in the organic EL display device according to the first embodiment.

FIG. 2 is a diagram for illustrating an example of the arrangement of light emitting sections IB, IG IR, and IW and transmissive regions TP in the organic EL display device according to the first embodiment. A plurality of wiring line regions XW, which extend in the vertical direction in FIG. 2 and are aligned in the horizontal direction in FIG. 2, and a plurality of wiring line regions YW, which extend in the horizontal direction in FIG. 2 and are aligned in the vertical direction in FIG. 2, are provided on the array substrate SB. One or more data lines DL and power lines PL aligned in the horizontal direction in FIG. 2 are disposed in each of the wiring line regions XW. One or more gate lines GL aligned in the vertical direction in FIG. 2 are disposed in each of the wiring line regions YW. The transmissive regions TP, which transmit external light incident on the display region of the array substrate SB, are provided in regions which are set on the array substrate SB and which are separated from each other by the wiring line regions XW and the wiring line regions YW. Each of the pixels PX, which expresses full colors, has the four light emitting sections IR, IG, IB, and IW, which are located around the intersection of the corresponding wiring line region XW and wiring line region YW and on the upper, lower, right, and left sides of the intersection. The light emitting sections IB and IW are provided so as to overlap the wiring line region XW in plan view, and the light emitting sections IR and IG are provided so as to overlap the wiring line region YW in plan view. The intersection where a wiring line region XW and a wiring line region YW intersect each other is located at the center of the four transmissive regions TP adjacent to each other in the upward/downward direction and the rightward/leftward direction.

The light emitting sections IB, IG, IR, and IW are light emitting regions of the light emitting elements LE (see FIG. 5) that emit blue, green, red, and white light, respectively. Each of the light emitting sections IB, IG, IR, and IW corresponds to a unit pixel, and the luminance of the light from each of the light emitting sections IB, IG, IR, and IW is controlled by the potential of the image signal supplied from the drive circuit XDV via the data lines DL. At least the light emitting sections IR and IG are adjacent to the both sides of each of the transmissive regions TP in the rightward/leftward direction. At least the light emitting sections IB and IW are adjacent to the both sides of each of the transmissive regions in the upward/downward direction. In the example shown in FIG. 2, a blue light emitting section IB and a white light emitting section IW sandwich a transmissive region TP in the upward/downward direction, and a red light emitting section IR and a green light emitting section IG sandwich the transmissive region TP in the rightward/leftward direction.

Figure 3:
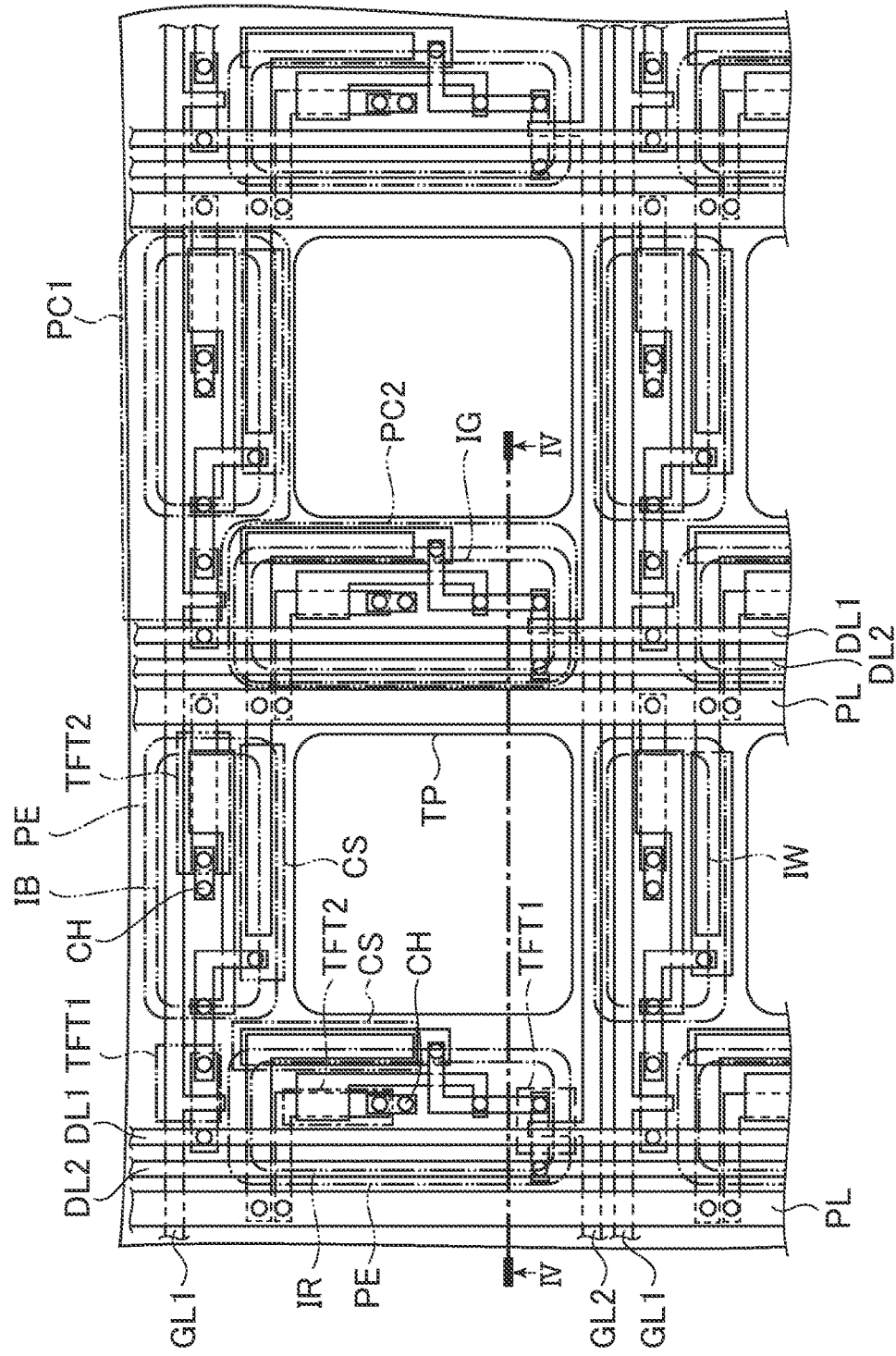
FIG. 3 is a plan view for showing an example of an array substrate of the organic EL display device shown in FIG. 2.
Figure 4:
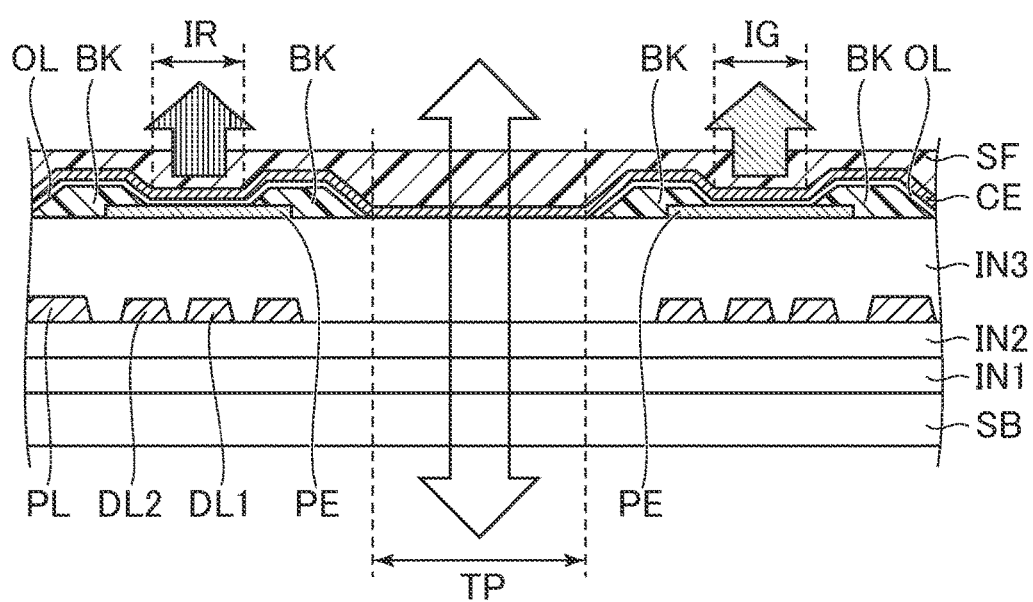
FIG. 4 is a cross-sectional view of the array substrate shown in FIG. 3 taken along the section line IV-IV.

The relationship between the light emitting sections IB, IG, IR, IW and the transmissive regions TP will be further described. FIG. 3 is a plan view showing an example of the array substrate SB of the organic EL display device shown in FIG. 2, and FIG. 4 is a cross-sectional view of the array substrate SB shown in FIG. 3 taken along the section line IV-IV. A plurality of data lines DL1 and DL2 and a plurality of power lines PL and a plurality of gate lines GL are disposed in the display region of the array substrate SB. The plurality of data lines DL1 and DL2 and the plurality of power lines PL are aligned in the horizontal direction and extend in the vertical directions in FIG. 3. The plurality of gate lines GL are aligned in the vertical direction and extend in the horizontal direction in FIG. 3. One vertical wiring line group consists of one of the data lines DL1, one of the data lines DL2, and one of the power lines PL is disposed in each of the wiring line regions XW in FIG. 2. In the vertical wiring line group, the data line DL1, the data line DL2, and the power line PL are aligned sequentially from the right so as to be adjacent to each other. One horizontal wiring line group consists of one of gate lines GL1 and one of gate lines GL2 is disposed in each of the wiring line regions YW in FIG. 2. In the horizontal wiring line group, one of the gate lines GL1 and one of the gate lines GL2 are aligned sequentially from below so as to be adjacent to each other. The transmissive regions TP are surrounded by the vertical wiring line groups and the horizontal wiring line groups. Each of the transmissive regions TP has the shape of a rounded rectangle.

In the upward/downward direction, two pixel circuits PC1 are disposed so as to be adjacent to the both sides (upper and lower sides) of one transmissive region TP. In the rightward/leftward direction, two pixel circuits PC2 are disposed so as to be adjacent to the both sides (right and left sides) of the one transmissive region TP. The pixel circuit PC1 below and adjacent to a transmissive region TP is also adjacent to the transmissive region TP below the pixel circuit PC1, and the pixel circuit PC2 on the right and adjacent to the transmissive region TP is also adjacent to the transmissive region TP on the right of the pixel circuit PC2. Therefore, Two pixel circuits PC1 and two pixel circuits PC2 are provided around one transmissive region TP.

A row of pixel circuits PC1 that includes the light emitting sections IB and IW corresponds to one of the gate lines GL1, and a row of pixel circuits PC2 that includes the light emitting sections IR and IG corresponds to one of the gate lines GL2. A column of pixel circuits PC1 corresponds to one of the data lines DL1, and a column of pixel circuits PC2 corresponds to one of the data lines DL2. A pixel circuit PC1 is connected to the corresponding gate line GL1 and the corresponding data line DL1, and a pixel circuit PC2 is connected to the corresponding gate line GL2 and the corresponding data line DL2.

Figure 5:
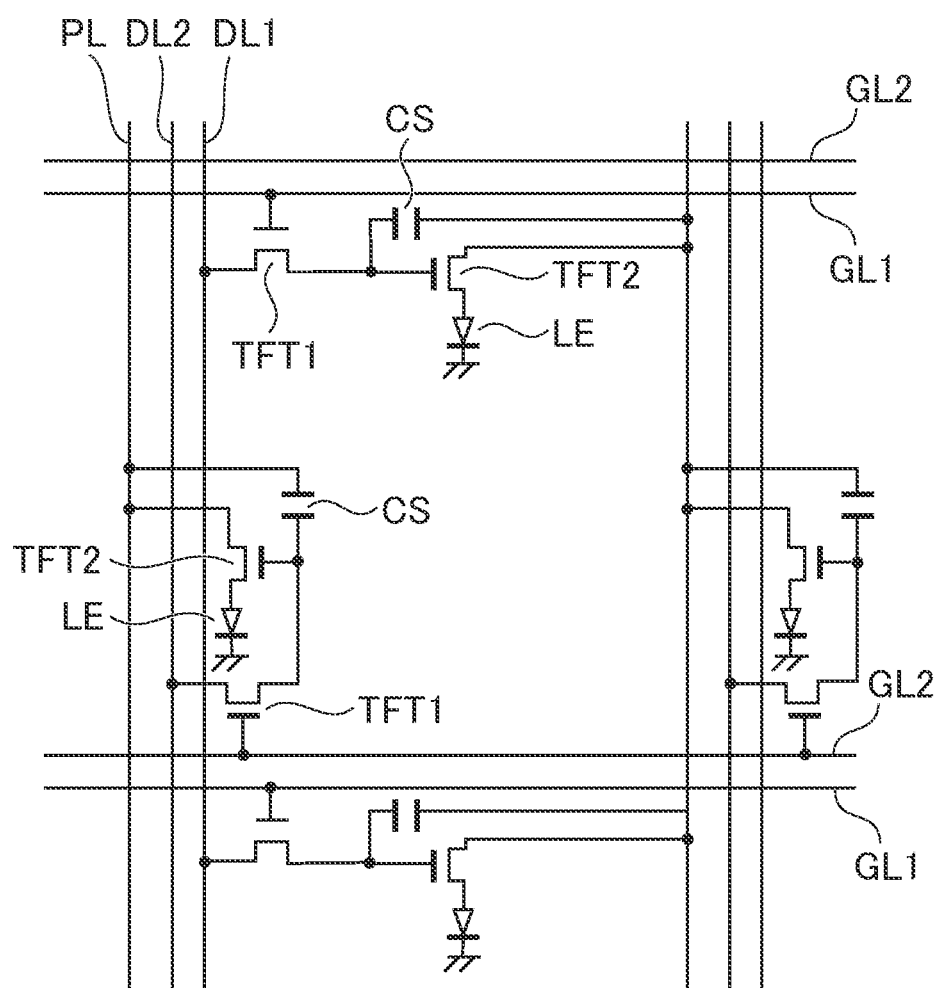
FIG. 5 is a circuit diagram for showing an equivalent circuit of a pixel circuit.

Each of the pixel circuits PC1 and the pixel circuits PC2 includes thin film transistors TET1 and TFT2, a capacitor CS, and a light emitting element LE (see FIG. 5). The light emitting element LE includes a pixel electrode PE, a light emitting layer OL, and a common electrode CE (see FIG. 4). The common electrode CE is integrated with the common electrodes CE contained in the other pixel circuits PC1 and PC2. In plan view, a pixel circuit PC1 overlaps gate lines GL1 and GL2, and a pixel circuit PC2 overlaps data lines DL1 and DL2. Further, in each of the pixel circuits PC1 and PC2, the thin film transistor TFT2 and the capacitor CS overlap the pixel electrode PE contained in the light emitting element LE and one of the light emitting sections IR, IG, IB, and IW located on the pixel electrode PE in plan view. Among the light emitting sections IB, IG, IR, and IW, those adjacent to the transmissive region TP in the upward/downward direction are disposed so as to overlap the gate lines GL1 and GL2 contained in the horizontal wiring line group, and those adjacent to the transmissive region TP in the rightward/leftward direction are disposed so as to overlap the data lines DL1 and DL2 contained in the vertical wiring line group.

As shown in FIG. 4, on the array substrate SB according to the first embodiment are sequentially stacked a semiconductor layer (not shown in FIG. 4), a first insulating layer IN1, a first conductive layer (not shown in FIG. 4), a second insulating layer IN2, a second conductive layer, a third insulating layer IN3, a third conductive layer, an organic insulating layer in which banks BK are formed, the light emitting layer OL, a layer that serves as the common electrode CE, and a sealing film SF. In the semiconductor layer, one electrode of each of the capacitors CS and the channel of each of the thin film transistors TFT1 and TFT2 are formed, and in the first conductive layer, the other electrode of each of the capacitors CS, the gate lines GL1 and GL2, and the gate of each of the thin film transistors TFT1 and TFT2 are formed. In the second conductive layer, the power lines PL, the data lines DL1 and DL2, and wiring lines in the pixel circuits PC1 and PC2 are formed. In the third conductive layer, the pixel electrodes PE are formed. The array substrate SB is made of a transparent material, for example, glass, and the semiconductor layer is made of a semiconductor material, for example, polysilicon and an oxide semiconductor. Each of the first to third conductive layers is a patterned metal thin film, and the common electrode CE is a transparent conductive film made, for example, of ITO or IZO. Each of the first to third insulating layers IN1, IN2, IN3 is made of an inorganic insulating material, and each of the banks BK and the sealing film SF is made of an organic insulating material. A undercoat film for preventing contamination of a semiconductor film may be provided between the semiconductor layer and the array substrate SB.

Each of the banks BK covers a peripheral edge portion of the corresponding pixel electrode PE and further covers a fixed-width region that is part of the upper surface of the third insulating layer IN3 and is located outside the outer edge of the pixel electrode PE in plan view. The pixel electrode PE and the light emitting layer OL are in contact with each other in a region of the pixel electrode PE where no bank BK is formed (bank opening), and current flows between the common electrode CE and the pixel electrode PE in the bank opening. The bank opening therefore serves as the light emitting sections IB, IG, IR, and IW. On the other hand, in the transmissive regions TP, no metal conductive films, that is, no wiring lines or no circuits of a variety of types, such as a thin film transistor, are formed, or no light emitting layer OL is provided, as shown in FIGS. 3 and 4. The thus configured transmissive regions TP transmit light passing through the array substrate SB from above and below. No common electrode CE may be provided in the transmissive regions.

FIG. 5 is a circuit diagram showing equivalent circuits of the pixel circuits PC1 and PC2. Each of the light emitting elements LE has an anode and a cathode that is electrically connected to a power supply circuit PW (see FIG. 1), which supplies reference potential. The anode of each of the light emitting elements LE corresponds to the pixel electrode PE (see FIG. 4), and the cathode of the light emitting element LE corresponds to a region that is part of the common electrode CE and located above any of the light emitting sections IR, IG, IB, and IW. The thin film transistor TFT2 has a source electrically connected to the anode of the light emitting element LE, a drain electrically connected to a power line PL, and a gate. The capacitor CS has a first electrode electrically connected to the power line PL and a second electrode electrically connected to the gate of the thin film transistor TFT2. The thin film transistor TFT1 has a drain, a source electrically connected to the gate of the thin film transistor TFT2, and a gate. The gate and the drain of the thin film transistor TFT1 contained in a pixel circuit PC1 are electrically connected to a gate line GL1 and a data line DL1, respectively. On the other hand, the gate and the drain of the thin film transistor TFT1 contained in a pixel circuit PC2 are electrically connected to a gate line GL2 and a data line DL2, respectively. The pixel circuits PC may differ from those shown in FIG. 5. Since whether a terminal of a transistor is the source or the drain is determined in accordance with the magnitude of the voltage, the source and the drain may be reversed in a case where each of the thin film transistors TFT1 and TFT2 is a p-type transistor or a case where another drive method is employed. Further, the semiconductor material that forms each of the TFTs may be LTPS (low-temperature polysilicon) or TAOS (oxide semiconductor), or a TFT made of LTPS and a TFT made of TAOS may be mixed with each other.

Also in each of the pixel circuits PC1 and PC2 in FIG. 3, the connection of the thin film transistor TFT1 to gate lines GL1 and GL2 and data lines DL1 and DL2, the connection of the thin film transistor TFT2 to a power line PL, and the connection in the pixel circuits PC1 and PC2 are performed in the same manner as in FIG. 5.

One of the pixel circuits PC1 shown in FIG. 3 will be further described below. The channel of the thin film transistor TFT1 is located in the semiconductor layer, is adjacent to the lower side of the gate line GL1, and extends from a portion where the channel overlaps the data line DL1 toward the right side in FIG. 3. Further, the channel intersects a downward protruding portion of the gate line GL1. The left end of the channel is connected to the data line DL1, and the right end of the channel is connected to a first wiring line in the second conductive layer. The first wiring line then extends rightward and bends downward in a halfway position. Along the first wiring line, an intermediate portion of the segment extending rightward is connected to a second wiring line integrated with the gate of the thin film transistor TFT2. The second electrode of the capacitor CS is located in the semiconductor layer and connected to the lower end of the first wiring line. The second electrode extends rightward from the connected portion to a point immediately before the power line PL. The first electrode of the capacitor CS is located in the first conductive layer, and extends, with facing the second electrode, from a point on the right of the lower end of the first wiring line to a portion where the first electrode overlaps the power line PL. The thin film transistor TFT2 is provided above the capacitor CS and on the right of the first wiring line in FIG. 3, and the channel thereof located in the semiconductor layer extends leftward from a portion where the channel overlaps the power line PL. An intermediate portion of the channel faces the gate of the thin film transistor TFT2. The right end of the channel is connected to the power line PL, and the left end of the channel is connected to a third wiring line located in the second conductive layer. The third wiring line extends leftward to some extent and is connected to the pixel electrode PE via a contact hole CH.

One of the pixel circuits PC2 shown in FIG. 3 will be further described below. The channel of the thin film transistor TFT1 is located in the semiconductor layer, is adjacent to the upper side of the gate line GL2, and extends rightward from a portion where the channel overlaps the data line DL2 in FIG. 3. The channel intersects the data line DL1 and further intersects an upward protruding portion of the gate line GL2. The left end of the channel is connected to the data line DL2, and the right end of the channel is connected to a first wiring line in the second conductive layer. The first wiring line then extends upward and bends rightward in a halfway position. Along the first wiring line, an intermediate portion of the region extending upward is connected to a second wiring line integrated with the gate of the thin film transistor TFT2. The second electrode of the capacitor CS is located in the semiconductor layer and connected to the right end of the first wiring line. The second electrode extends upward from the connected portion to a point immediately before the thin film transistor TFT1 contained in the pixel circuit PC1. The first electrode of the capacitor CS is located in the first conductive layer, and extends, with facing the second electrode, from a point above the lower end of the first wiring line to a point immediately before the thin film transistor TFT1 contained in the pixel circuit PC1, further bends leftward, and extends to a point where the first electrode overlaps the power line PL. The thin film transistor TFT2 is provided on the left of the capacitor CS and above the first wiring line, and the channel thereof located in the semiconductor layer extends rightward from the portion where the channel overlaps the power line PL and further extends downward from a point immediately before the capacitor CS. An intermediate portion of the downward extending portion of the channel faces the gate of the thin film transistor TFT2. The left end of the channel is connected to the power line PL, and the lower end of the channel is connected to a third wiring line located in the second conductive layer. The third wiring line extends downward to some extent from the position where the third wiring line is connected to the channel and is connected to the pixel electrode PE via a contact hole CH.

In a structure in which a transmissive region TP is provided between two pixel regions each including the light emitting region when viewed in one direction (vertical direction, for example), and no light emitting region is provided between transmissive regions TP in a direction that intersects the one direction (horizontal direction, for example) but only wiring lines are provided therebetween, a problem that will be described below occurs. In this structure, the transmissive regions TP are substantially continuously aligned in the direction that intersects the one direction (horizontal direction, for example). That is, the transmissive regions TP form a slit extending in the direction that intersects the one direction (horizontal direction, for example). The slit then functions as a diffraction grating and therefore causes a phenomenon in which viewing angle is restricted and a phenomenon in which reflected external light is colored to occur, resulting in concern about significant degradation in image quality. On the other hand, in the organic EL display device according to the present embodiment, the light emitting elements are arranged so that the upper, lower, right, and left sides of each of the transmissive regions TP are surrounded by the light emitting elements. The transmissive regions TP therefore do not form a slit. Occurrence of the phenomenon in which viewing angle is restricted or the phenomenon in which reflected external light is colored can therefore be suppressed.

The arrangement of the light emitting sections IR, IG, IB, and IW may differ from the example of the arrangement shown in FIG. 2. Each of the transmissive regions TP only needs to be sandwiched by at least part of one or more of the plurality of light emitting sections when viewed in the vertical direction (first direction), and the transmissive region TP further only needs to be sandwiched by at least part of one or more of the plurality of light emitting sections when viewed in the horizontal direction (second direction that intersects first direction). Further, the green light emitting section IG and the white light emitting section IW may be disposed so as to overlap wider one of the wiring line regions XW and YW, and the red light emitting section IR and the blue light emitting section IB may be disposed so as to overlap narrower one of the wiring line regions XW and YW. In FIG. 2, the wiring line regions XW and YW are formed so that the wiring line regions XW are wider than the wiring line regions YW. It is assumed in the description that the width of the wiring line regions XW is the width of the vertical wiring line groups (width from left end of power line PL to right end of data line DL1 in FIG. 3), and the width of the wiring line regions YW is the width of the horizontal wiring line groups (width from lower end of gate line GL1 to upper end of gate line GL2 in FIG. 3). In this configuration, the transmissive regions TP can be maximized when the sizes of the light emitting sections IG and IW, which emit light of colors that greatly affect a human's eyes (highly visible color) and light of colors that dominate high-luminance light emission, are increased and the sizes of the light emitting sections IR and IB, which emit light of colors that do not greatly affect a human's eyes (poorly visible color), are decreased. Thus sufficiently large transmissive regions TP can be readily provided with the image quality perceived by a human's eyes maintained. Further, the blue light emitting section IB may be disposed so as to overlap wider one of the wiring line regions XW and YW. Disposing the blue light emitting section IB, which emits light of poorly visible color, in a wider wiring line region allows increase in the area of the light emitting section that emits light of a poorly visible color, whereby the luminance of the light of the poorly visible color can be improved. The light emitting sections IG and IW may be disposed so as to overlap narrower one of the wiring line regions XW and YW. The reason for this is that even when the light emitting sections are located in a narrower wiring line region and the area of the light emitting sections therefore decreases, degradation in image quality or failure of high-luminance light emission hardly occur because the light emitting sections emit light of highly visible colors.

Figure 6:
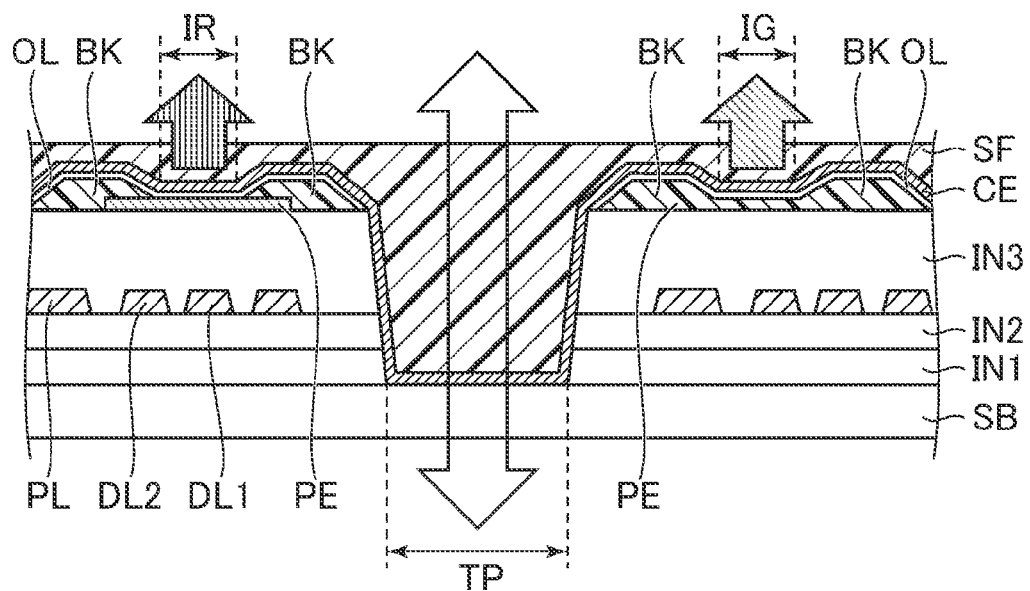
FIG. 6 is a cross-sectional view for showing another example of the array substrate.

The cross-sectional structure of each of the transmissive regions TP may differ from the example of the structure shown in FIG. 4. FIG. 6 is a cross-sectional view showing another example of the array substrate SB. The example shown in FIG. 6 differs from the example shown in FIG. 4 in that the first insulating layer IN1, the second insulating layer IN2, and the third insulating layer IN3 are provided so as to avoid the transmissive region TP. In the example shown in FIG. 6, the first insulating layer IN1, the second insulating layer IN2, and the third insulating layer IN3 in the transmissive region TP are removed so that a recess is formed. The recess that overlaps the transmissive region TP in plan view is filled with the sealing film SF, which functions as a planarizing film. The light transmittance of the transmissive region can therefore be further improved.

Figure 7:
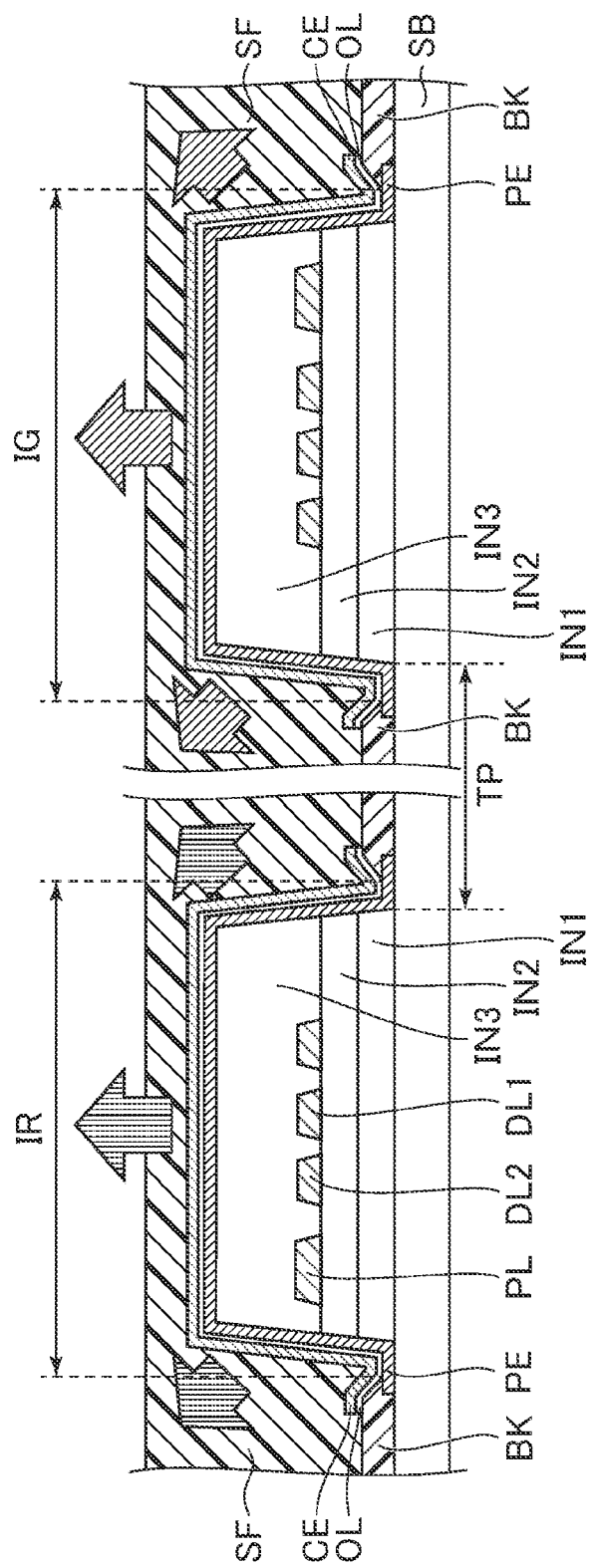
FIG. 7 is a cross-sectional view for showing another example of the array substrate.

The light emitting sections IR, IG, IB, and IW may further be provided on the side surface of the recess. That is, the pixel electrodes PE, the light emitting layers OL, and the common electrode CE may be disposed on the side surface of the recess. FIG. 7 is a cross-sectional view showing another example of the array substrate SB. In the example shown in FIG. 7, each of the pixel electrodes PE is provided along a region extending from the upper surface of the third insulating layer IN3 via the side surfaces of the first to third insulating layers IN1, IN2, IN3 onto the bottom surface of the recess, and the bank BK is provided also on the bottom surface of the recess so as to cover an end portion of the pixel electrode PE. The light emitting layer OL is provided so as to cover the pixel electrode PE and so as to be in contact with the pixel electrode PE except the end portion, and the portion that forms the pixel electrode PE but is not covered with the bank BK serves as one of the light emitting sections IR, IG, IB, and IW. The sizes of the light emitting sections IR, IG, IB, and IW can therefore be increased, whereby display luminance is improved.

Figure 8:
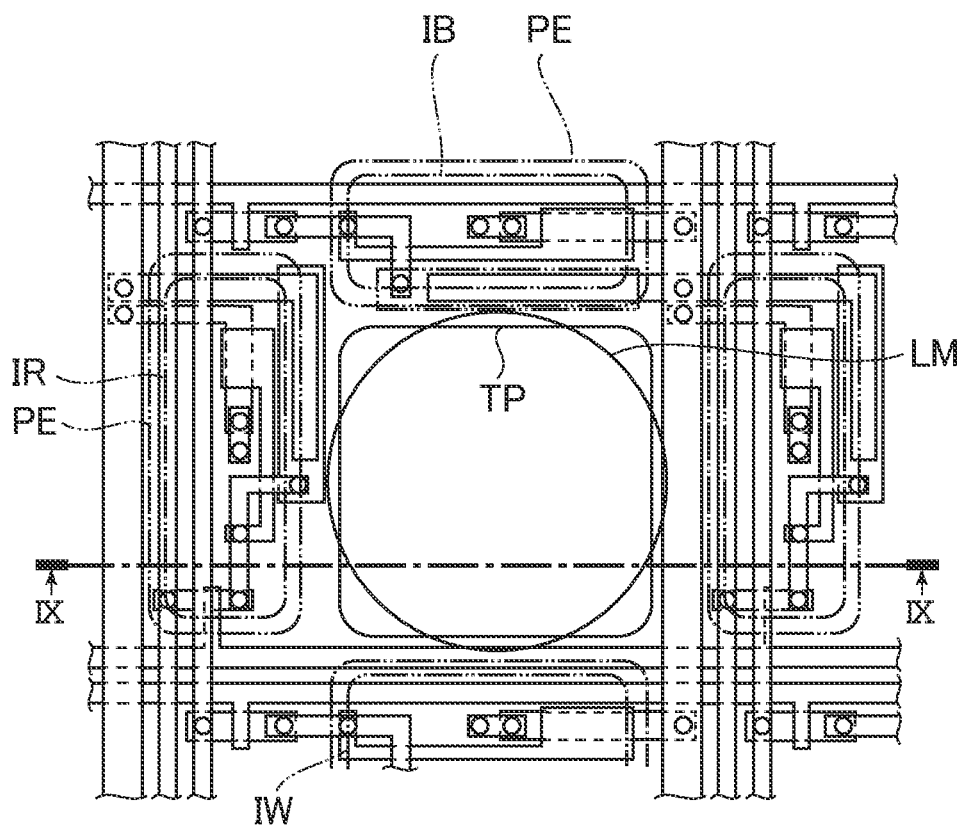
FIG. 8 is a plan view for showing another example of the array substrate.
Figure 9:
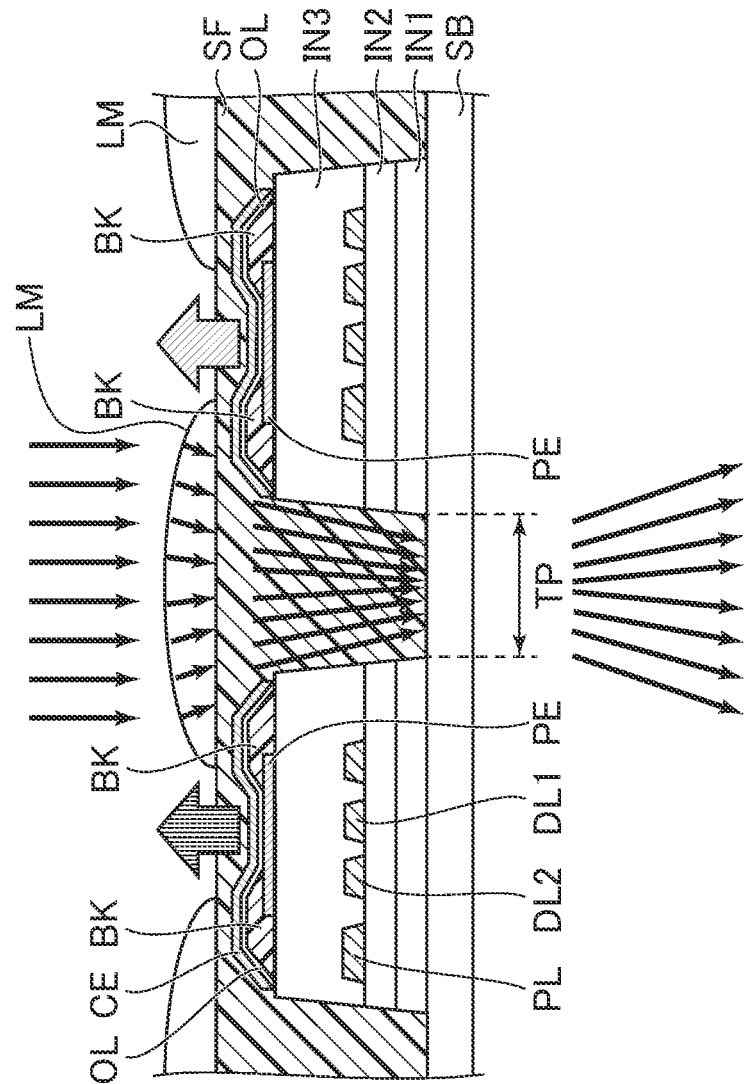
FIG. 9 is a cross-sectional view of a pixel circuit on the array substrate shown in FIG. 8 taken along the section line IX-IX.

FIG. 8 is a plan view showing another example of the array substrate SB, and FIG. 9 is a cross-sectional view of the pixel circuits PC1 and PC2 on the array substrate SB shown in FIG. 8 taken along the section line IX-IX. The example shown in FIGS. 8 and 9 primarily differs from the example shown in FIG. 6 in that a microlens LM is provided above each of the transmissive regions TP. In the example shown in FIGS. 8 and 9, the microlens LM is provided so that a central portion of the microlens LM overlaps a central portion of the transmissive region TP and that the microlens LM does not overlap the light emitting section IR, IG, IB, or IW in plan view. The arrows in FIG. 9 represent paths along which external light incident from above travels. As seen from FIG. 9, the microlens LM allows transmission of light incident on a region greater than the transmissive region TP for improvement in the transmittance as compared with a case where no microlens LM is provided. The microlens LM may be made of SiN or may be formed integrally with the sealing film SF.

Figure 10:
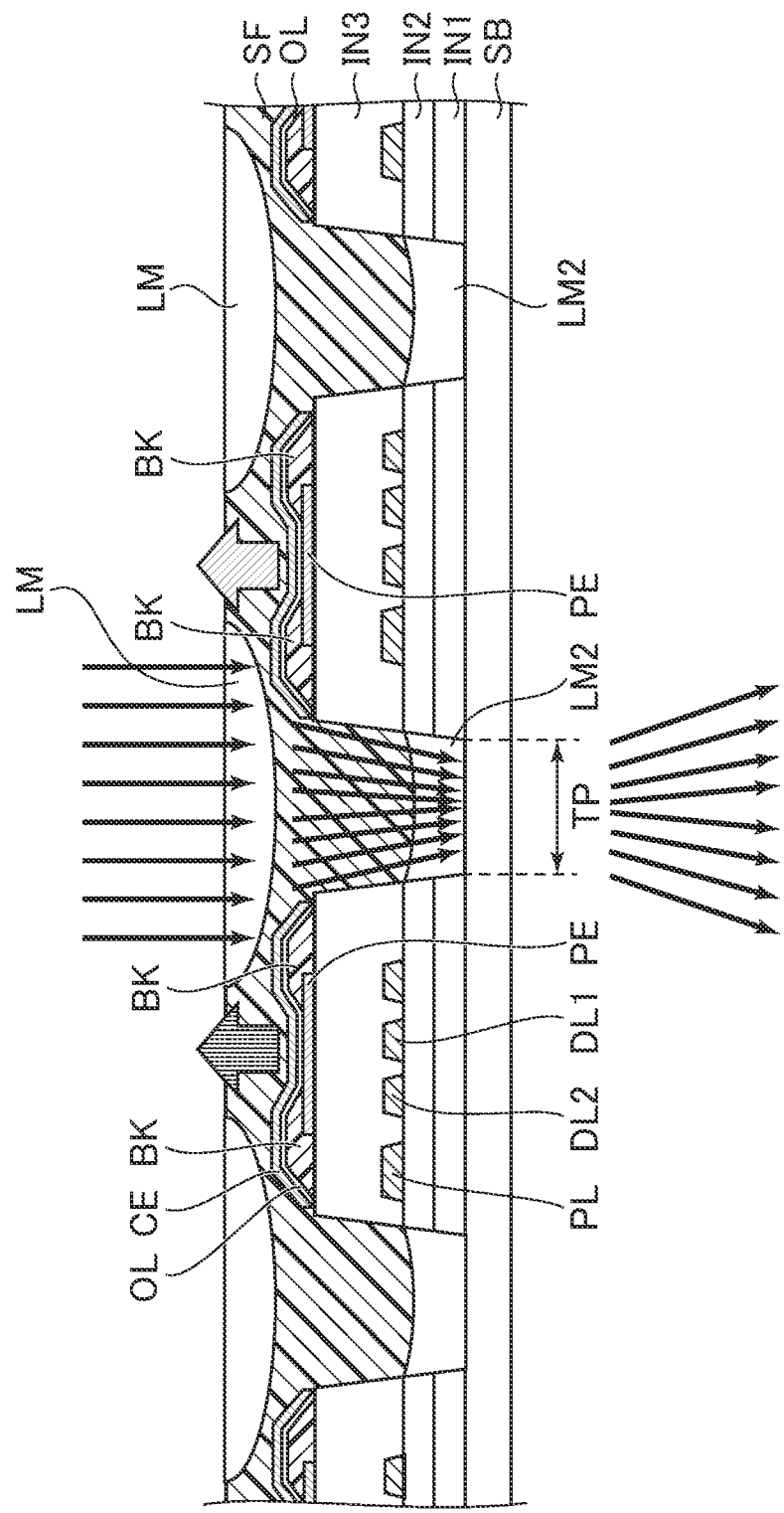
FIG. 10 is a cross-sectional view for showing another example of the array substrate.

FIG. 10 is a cross-sectional view showing another example of the array substrate SB. The example shown in FIG. 10 differs from the example shown in FIG. 9 in that the sealing film SF has recesses and the microlens LM is attached in each of the recesses, and in that another microlens LM2 is provided in each of the transmissive regions TP and between the array substrate SB and the sealing film SF. The shape shown in FIG. 10 also allows transmission of light incident on a region greater than the transmissive region TP for improvement in the transmittance as compared with a case where no microlens LM or LM2 is provided.

Figure 11:
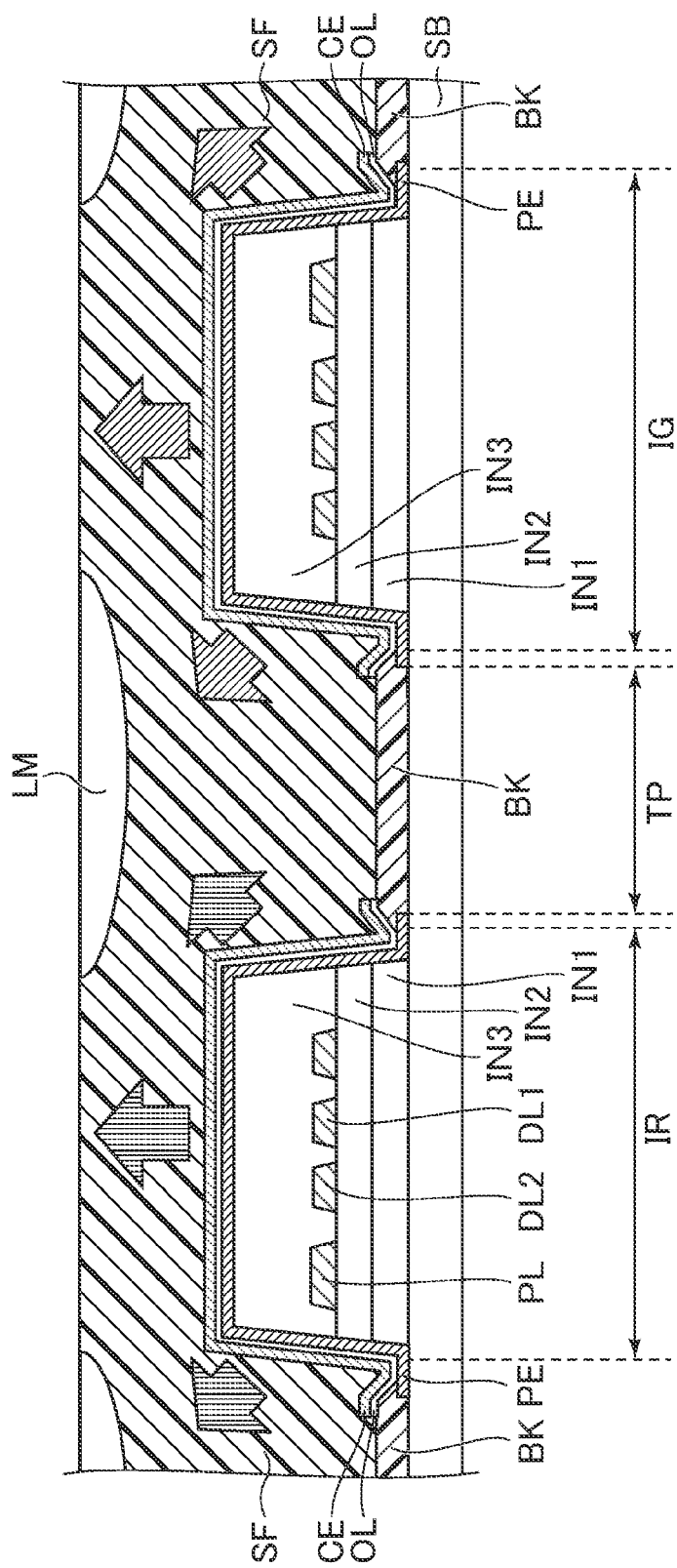
FIG. 11 is a cross-sectional view for showing another example of the array substrate.

Further, the microlens LM may be combined with the example shown in FIG. 7. FIG. 11 is a cross-sectional view showing another example of the array substrate SB. The example shown in FIG. 11 primarily differs from the example shown in FIG. 7 in that the sealing film SF has recesses and the microlens LM is attached in each of the recesses. In the example shown in FIG. 11, the bank BK is provided across each of the transmissive regions TP. As a result, the transmittance of the transmissive region TP can be improved, and the luminance of the light from the light emitting sections IR, IG, IB, and IW can also be improved, as compared with the example shown in FIG. 4.

Figure 12:
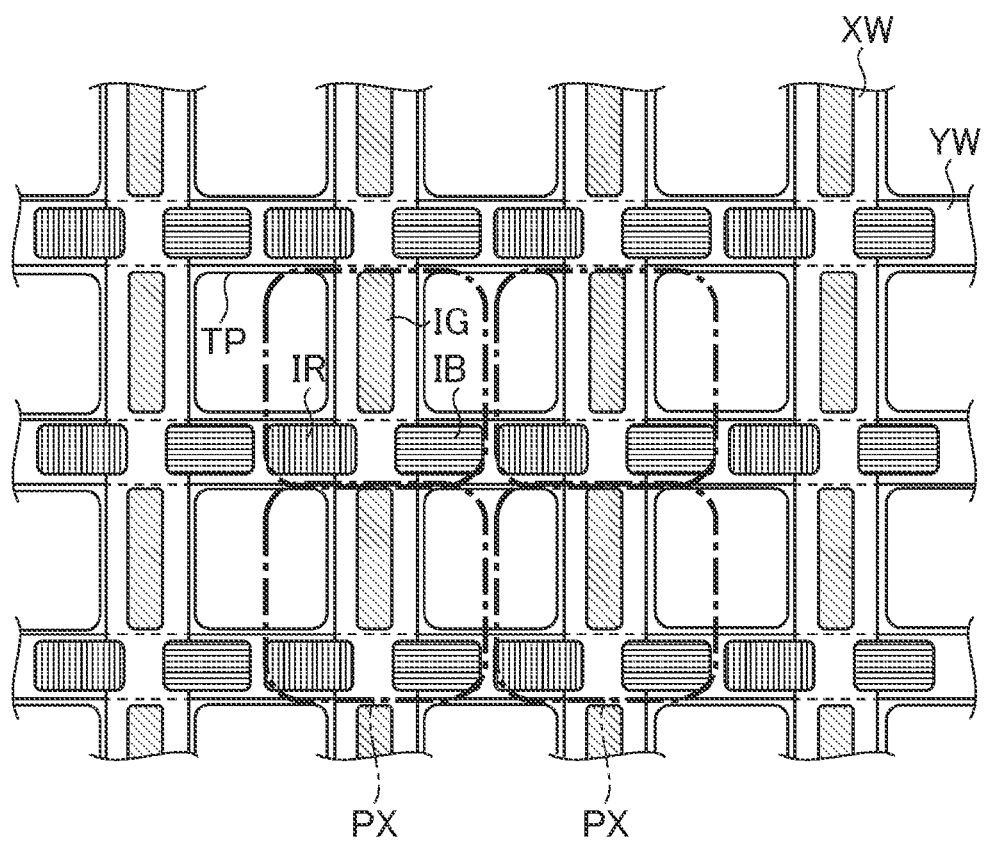
FIG. 12 is a diagram for illustrating another example of the arrangement of the light emitting sections and the transmissive regions.

FIG. 12 is a diagram for illustrating another example of the arrangement of the light emitting sections IR, IG, and IB and the transmissive regions TP. FIG. 12 shows an example of an organic EL display device that includes no white light emitting section IW and achieves full-color pixels PX by using the three primary colors of light. In the example shown in FIG. 12, one green light emitting section IG is disposed so as to be in contact with each of the right and left sides of each of the transmissive regions TP, and one blue light emitting section IB and one red light emitting section IR are adjacent to each of the upper and lower sides of each of the transmissive regions TP. The combination of one blue light emitting section IB and one red light emitting section IR is called a horizontal light emission group. Each of the transmissive regions TP is sandwiched between the two green light emitting sections IG in the rightward/leftward direction in FIG. 12 and sandwiched between the two horizontal light emission groups in the upward/downward direction in FIG. 12. The portion where a wiring line region XW and a wiring line region YW intersect each other is called an intersection. A green light emitting section IG is provided between intersections adjacent to each other in the upward/downward direction so that the green light emitting section IG overlaps the wiring line region XW. A blue light emitting section IB and a red light emitting section IR are provided sequentially from the left between intersections adjacent to each other in the rightward/leftward direction, and the light emitting sections IB and IR overlap the wiring line region XW in plan view.

The pixels PX are provided on an intersection basis. In FIG. 12, each of the pixels PX includes one green light emitting section IG adjacent to the upper side of the intersection, one red light emitting section IR adjacent to the left side of the intersection, and one blue light emitting section IB adjacent to the right side of the intersection. Although no description of the pixel circuits PC is made, each of the light emitting sections IR, IG, and IB overlaps the thin film transistor TFT2 and the capacitor CS, and each of the light emitting sections IR, IG, and IB overlaps the data lines DL1 and DL2 or the gate lines GL1 and GL2, as in the example shown in FIG. 2. The positions of the green, blue, and red light emitting sections are not limited to those in the present embodiment and can be swapped with each other as required and as appropriate. For example, the light emitting section IW, which emits light of a highly visible color, may be disposed in a wider wiring line region, or the light emitting section IB and light emitting section IR, which emits light of a poorly visible color, may be disposed in a wider wiring line region.

Figure 13:
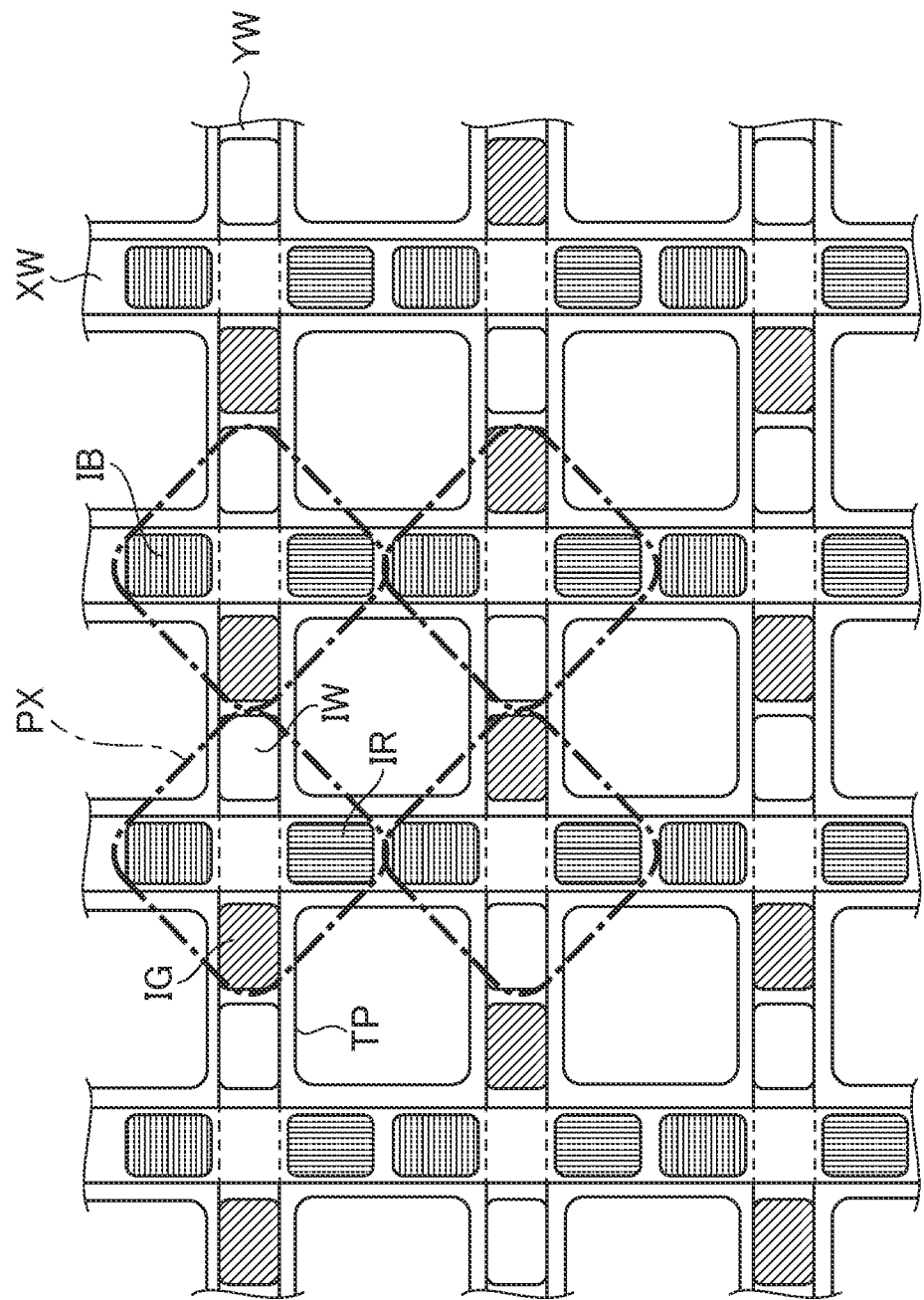
FIG. 13 is a diagram for illustrating another example of the arrangement of the light emitting sections and the transmissive regions.

FIG. 13 is a diagram for illustrating another example of the arrangement of the light emitting sections IB, IG, IR, and IW and the transmissive regions TP. In the example shown in FIG. 13, unlike in the example shown in FIG. 2, two of the light emitting sections IR, IG, IB, and IW are disposed between two intersections adjacent to each other in the upward/downward direction or the rightward/leftward direction. One of the light emitting sections IR, IG, IB, and IW is adjacent to one of the two intersections, and the other one of the light emitting sections IR, IG, IB, and IW is adjacent to the other intersection. The pixels PX are provided on every intersection, and each of the pixels PX includes a light emitting section IB adjacent to the upper side of the corresponding intersection, a light emitting section IR adjacent to the lower side of the intersection, a light emitting section IW adjacent to the left side of the intersection, and a light emitting section IG adjacent to the right side of the intersection. Although no description of the pixel circuits PC is made, each of the light emitting sections IR, IG, IB, and IW overlaps the thin film transistor TFT2 and the capacitor CS, and each of the light emitting sections IR, IG, IB, and IW overlaps the data lines DL1 and DL2 or the gate lines GL1 and GL2, as in the example shown in FIG. 2.

Second Embodiment

An organic EL display device according to a second embodiment of the invention will be described below primarily on differences from the first embodiment.

Figure 14:
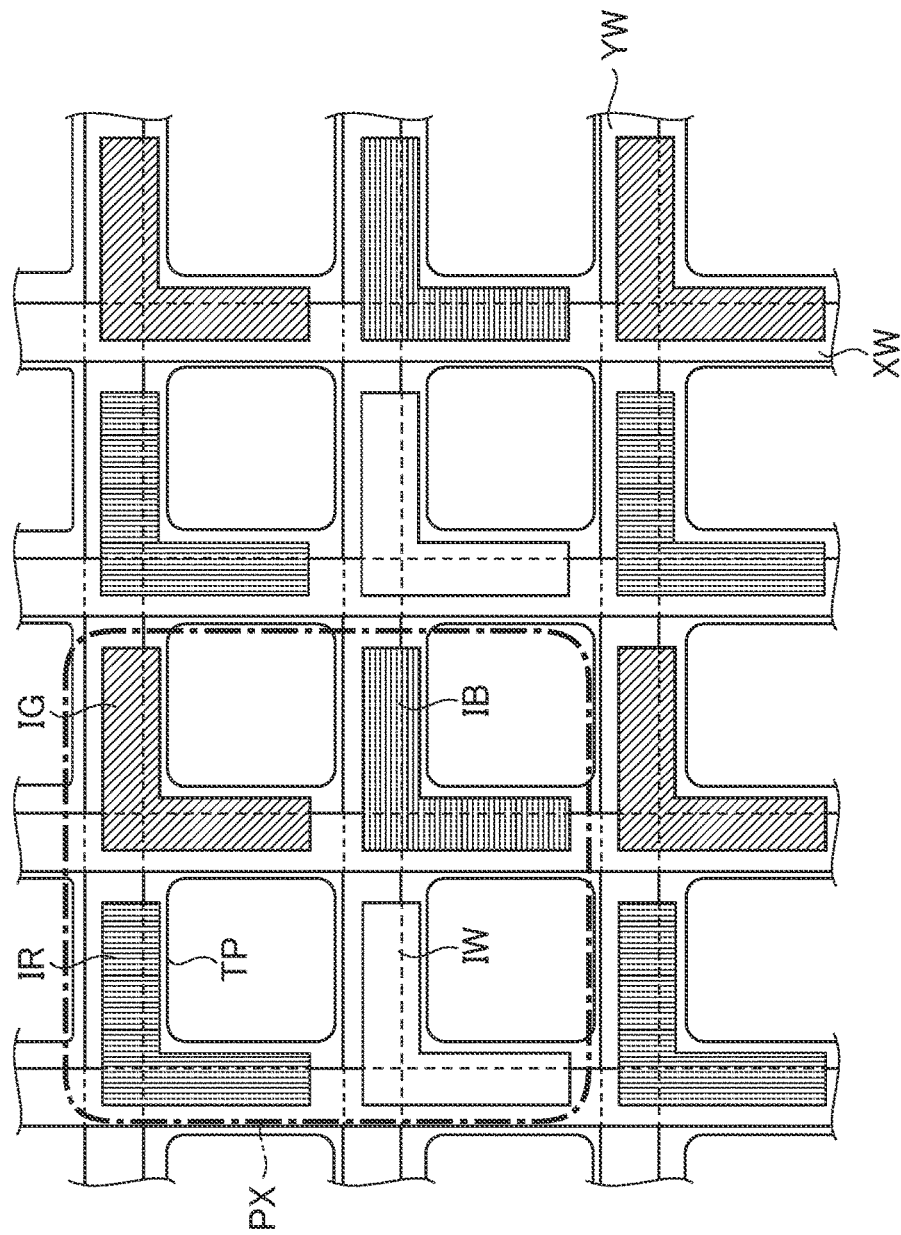
FIG. 14 is a diagram for illustrating an example of the arrangement of light emitting sections and transmissive regions in an organic EL display device according to a second embodiment.

FIG. 14 is a diagram for illustrating an example of the arrangement of the light emitting sections IR, IG, IB, and IW and the transmissive regions TP in the organic EL display device according to the second embodiment. A plurality of wiring line regions XW, which extend in the vertical direction in FIG. 14, and a plurality of wiring line regions YW, which extend in the horizontal direction in FIG. 14, are provided on the array substrate SB. A data line DL1 (see FIG. 15) and a power line PL are disposed in each of the wiring line regions XW. A gate line GL1 (see FIG. 15) is disposed in each of the wiring line regions YW. A unit pixel is provided in correspondence with the intersection where a wiring line region XW and a wiring line region YW intersect each other. A pixel PX, which achieves full-color display, consists of unit pixels in a matrix consists of two rows and two columns. In a pixel PX, the upper right, upper left, lower right, and lower left unit pixels correspond to the light emitting sections IR, IG, IB, and IW, respectively.

In plan view, each of the light emitting sections IR, IG, IB, and IW continuously extends from one side (upper side) of the corresponding transmissive region TP in the upward/downward direction toward one side (left side) thereof in the rightward/leftward direction, and each of the light emitting sections IR, IG, IB, and IW has an L-like shape. Each of the light emitting sections IR, IG, IB, and IW is disposed so as to be adjacent to the upper and left sides of the corresponding transmissive region TP. Each of the light emitting sections IR, IG, IB, and IW overlaps with a wiring region XW and a wiring region YW in plan view.

Figure 15:
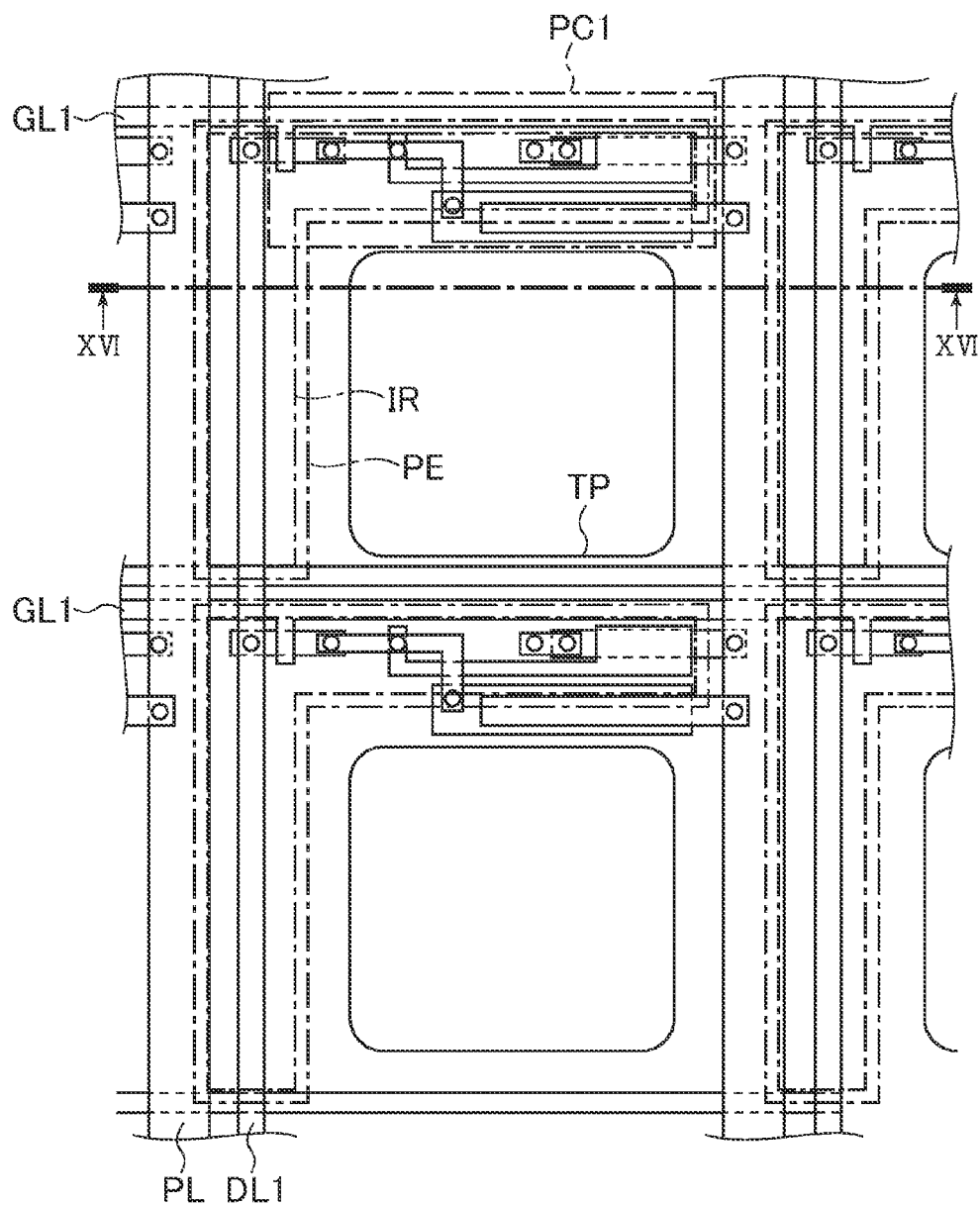
FIG. 15 is a plan view for showing an example of an array substrate of the organic EL display device shown in FIG. 14.
Figure 16:
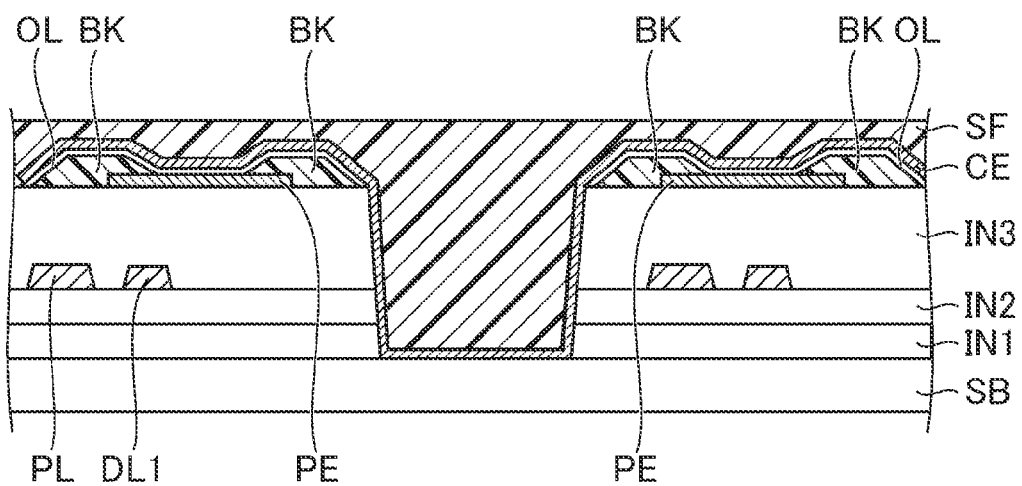
FIG. 16 is a cross-sectional view of the array substrate shown in FIG. 15 taken along the section line XVI-XVI.

FIG. 15 is a plan view showing an example of the array substrate SB of the organic EL display device shown in FIG. 14. FIG. 16 is a cross-sectional view of the array substrate SB shown in FIG. 15 taken along the section line XVI-XVI. FIGS. 15 and 16 correspond to FIGS. 3 and 4 in the first embodiment, respectively. In the display region of the array substrate SB, a plurality of data lines DL1 and a plurality of power lines PL aligned in the horizontal direction and extending in the vertical direction in FIG. 15 are disposed, and a plurality of gate lines GL1 aligned in the vertical direction and extending in the horizontal direction in FIG. 15 are further disposed. In each of the wiring line regions XW in FIG. 15, one vertical wiring line group consists of one of the data lines DL1 and one of the power lines PL is aligned. In the vertical wiring line group, the data line DL1 and the power line PL are aligned sequentially from the right so as to be adjacent to each other. In each of the wiring line regions YW in FIG. 15, one horizontal wiring line group consists of one of the gate lines GL1 and one wiring line that extends in the horizontal direction is arranged.

In the upward/downward direction, two pixel circuits PC1 are disposed so as to be adjacent to the both sides (upper and lower sides) of one transmissive region TP. In the present embodiment, one pixel circuit PC1 is provided per transmissive region TP. The details of each of the pixel circuits PC1 are the same as those shown in FIG. 4. In plan view, the thin film transistor TFT2 and the capacitor CS included in each of the pixel circuits PC1 overlap any of the light emitting sections IR, IG, IB, and IW and the pixel electrode PE that forms the light emitting section.

The structure shown in FIG. 16 primarily differs from the structure shown in FIG. 6 in that no data line DL2 is present. The difference results from the fact that no pixel circuit PC2 is present.

Figure 17:
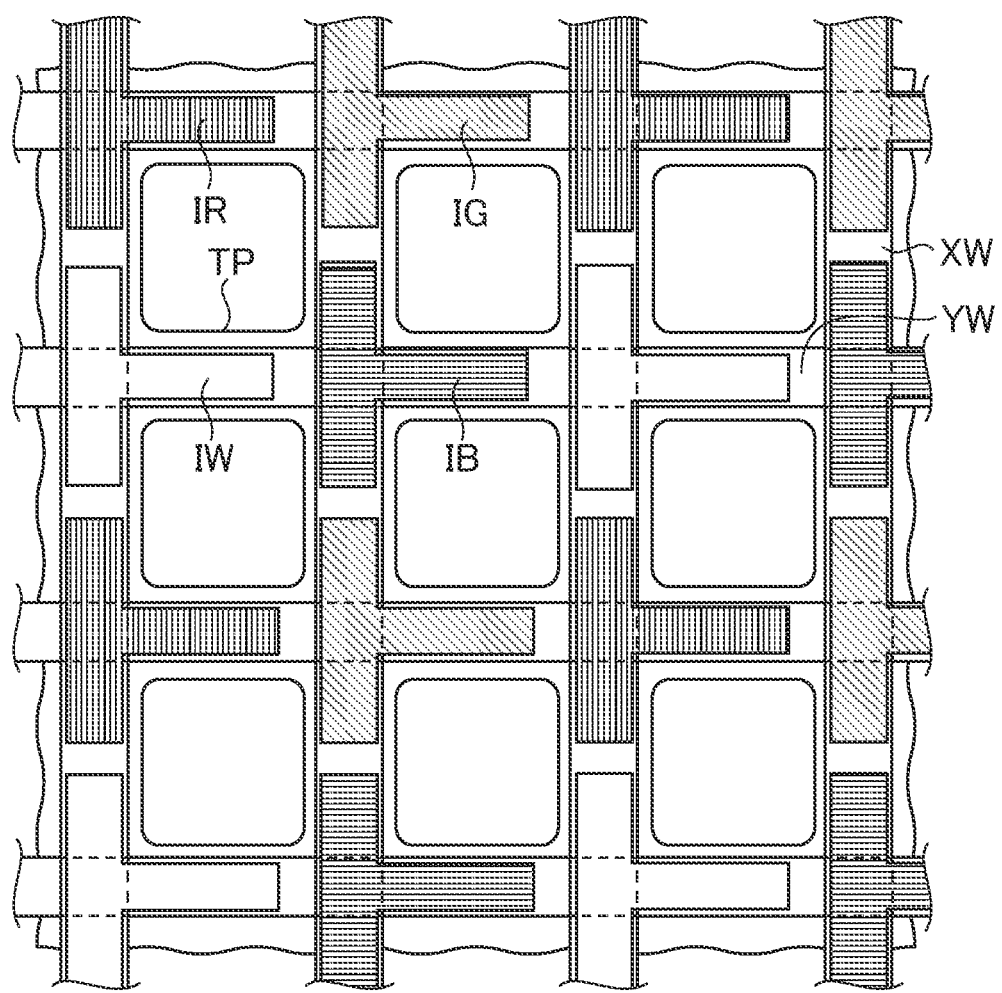
FIG. 17 is a diagram for illustrating another example of the arrangement of the light emitting sections and the transmissive regions.

The light emitting sections IR, IG, IB, and IW do not necessarily have the shape shown in FIG. 14. FIG. 17 is a diagram for illustrating another example of the arrangement of the light emitting sections IR, IG, IB, and IW and the transmissive regions TP. In the example shown in FIG. 17, each of the light emitting sections IR, IG, IB, and IW extends from the corresponding intersection in the upward/downward direction and further extends from the intersection in one of the rightward and leftward directions. Each of the light emitting sections IR, IG, IB, and IW has a T-like shape. Look at the transmissive regions TP from a different angle as follows: Consider four transmissive regions TP that are located on the upper left, upper right, lower left, and lower right sides of an intersection and are adjacent to each other in the upward/downward direction and the rightward/leftward direction. The intersection overlaps any of the light emitting sections IR, IG, IB, and IW. The light emitting section continuously extends from the space between the pair of transmissive regions TP adjacent to each other in the upward/downward direction (upper right and lower right transmissive regions TP) to the spaces between the two pairs of transmissive regions TP adjacent to each other in the rightward/leftward direction. Further, the light emitting sections IR, IG, IB, and IW are disposed so that the rightward/leftward direction coincides with the upward/downward direction of the T-like shape. Moreover, the upward/downward direction of the T-like shape is fixed (oriented rightward) irrespective of the positions of the light emitting sections IR, IG, IB, and IW.

Figure 18:
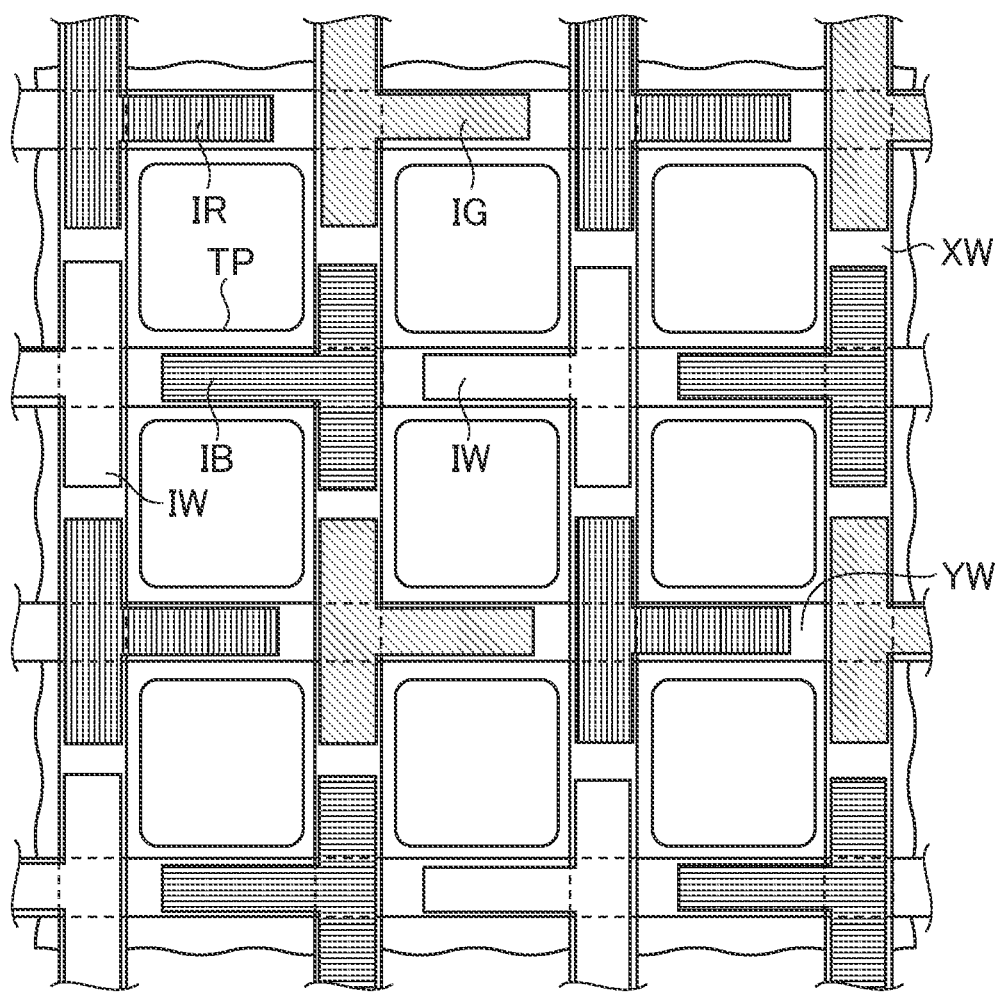
FIG. 18 is a diagram for illustrating an example of the arrangement of the light emitting sections and the transmissive regions.

FIG. 18 is a diagram for illustrating another example of the arrangement of the light emitting sections IR, IG, IB, and IW and the transmissive regions TP. The example shown in FIG. 18 is the same as the example shown in FIG. 17 in that each of the light emitting sections IR, IG, IB, and IW has a T-like shape and has the portion extending from the corresponding intersection in the upward/downward direction. On the other hand, in the example shown in FIG. 18, each of the light emitting sections IR, IG, IB, and IW located in a certain row extends from the corresponding intersection in one of the rightward and leftward directions (rightward, for example), but that each of the light emitting sections IR, IG, IB, and IW located in the following row extends from the corresponding intersection in the other of the rightward and leftward directions (leftward, for example). In other words, the light emitting sections IR, IG, IB, and IW are arranged so that the rightward/leftward direction coincides with the upward/downward direction of the T-like shape and the upward/downward direction of the T-like shape alternately reversed (rightward direction row and leftward direction row alternately appear).

Third Embodiment

An organic EL display device according to a third embodiment of the invention will be described below primarily on differences from the second embodiment.

Figure 19:
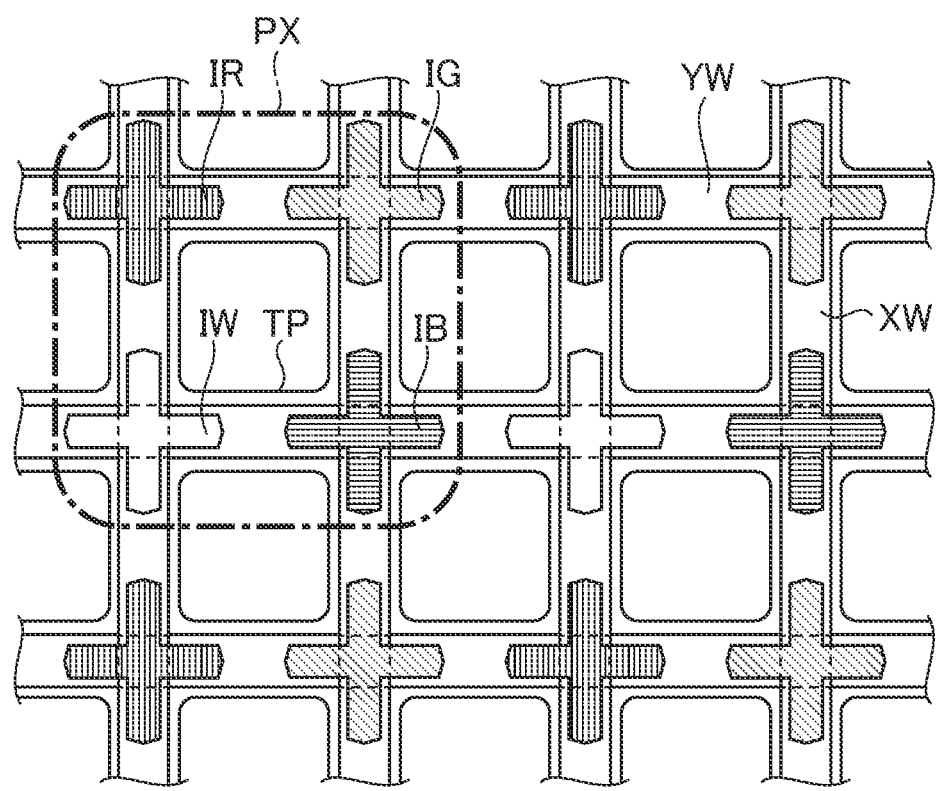
FIG. 19 is a diagram for illustrating an example of the arrangement of light emitting sections and transmissive regions in an organic EL display device according to a third embodiment.

FIG. 19 is a diagram for illustrating an example of the arrangement of the light emitting sections IR, IG, IB, and IW and the transmissive regions TP in the organic EL display device according to the third embodiment. The third embodiment is the same as the second embodiment in that a unit pixel is provided in correspondence with the intersection where a wiring line region XW and a wiring line region YW intersect each other and a pixel PX, which achieves full-color display, consists of unit pixels in a matrix consists of two rows and two columns. On the other hand, the example shown in FIG. 19 primarily differs from the examples shown in FIGS. 14, 17, and 18 in that each of the light emitting sections IR, IG, IB, and IW has a cross-like shape. In the example shown in FIG. 19, each of the light emitting sections IR, IG, IB, and IW is located at the center of four transmissive regions TP present on the upper left, upper right, lower left, and lower right sides of the light emitting section and adjacent to each other in the upward/downward direction and the rightward/leftward direction. Each of the light emitting sections IR, IG, IB, and IW extends from the corresponding intersection upward, downward, rightward, and leftward. Looking at the light emitting sections IR, IG, IB, and IW from a different angle, each of the light emitting sections has a first portion extending through the spaces between the two pairs of transmissive regions TP adjacent to each other in the upward/downward direction and a second portion extending through the spaces between the two pairs of transmissive regions TP adjacent to each other in the rightward/leftward direction, and the first portion and the second portion are continuously connected to each other at the centers thereof. In the configuration described above, the light emitting section IW may be omitted and the three colors produced by the light emitting sections IR, IG, and IB may form a pixel, and another color light emitting region may be added to the region where the light emitting section IW is removed.

Figure 20:
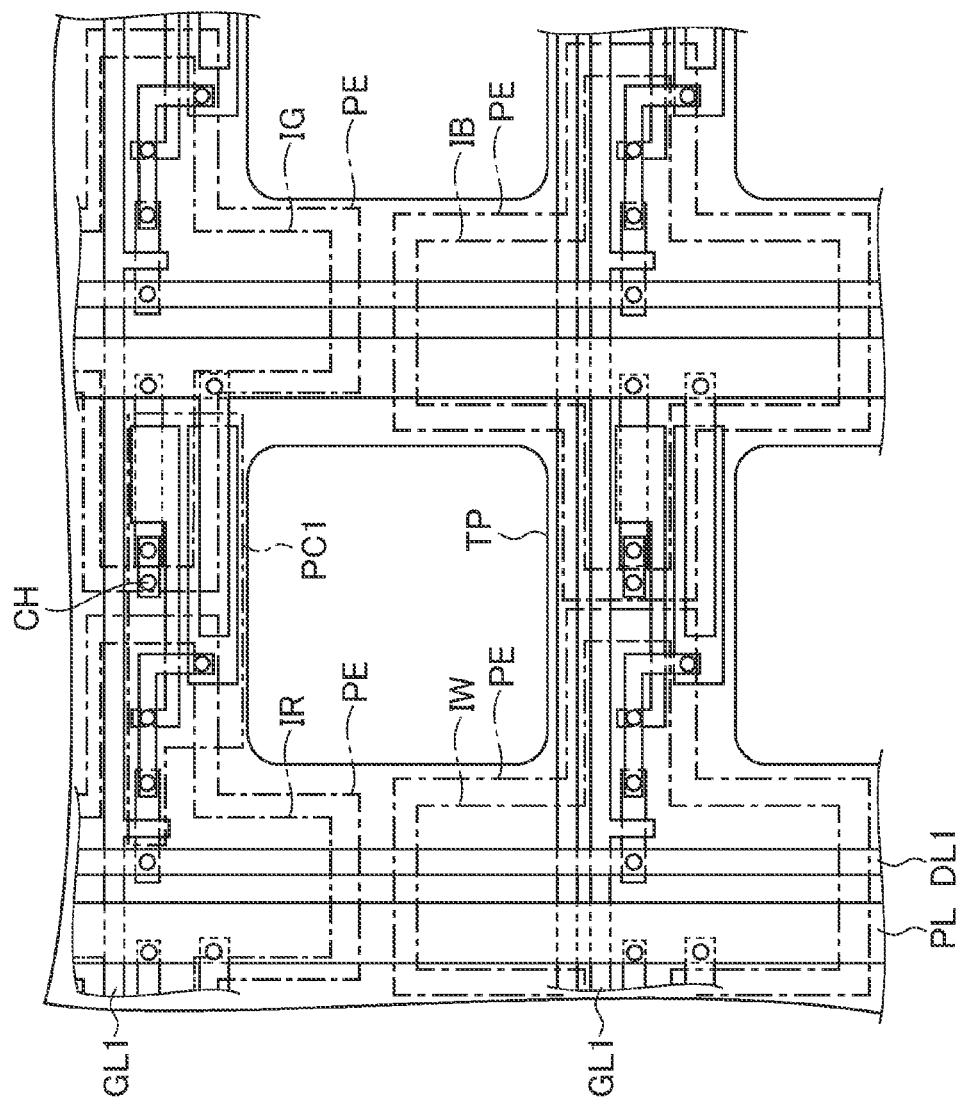
FIG. 20 is a plan view for showing an example of an array substrate of the organic EL display device shown in FIG. 19.

FIG. 20 is a plan view showing an example of the array substrate SB of the organic EL display device shown in FIG. 19. The example shown in FIG. 20 primarily differs from the example shown in FIG. 15 in that the pixel electrode PE has a cross-like shape in accordance with the shape of each of the light emitting sections IR, IG, IB, and IW. In the example shown in FIG. 19, each of the light emitting sections IR, IG, IB, and IW overlaps the data line DL1 and the gate line GL1, but an image signal is supplied to the pixel circuit PC1, which controls any of the luminance of the light from the light emitting sections IR, IG, IB, and IW, from the data line DL1 located on the left of the data line DL1 that the light emitting section overlaps. The reason for this is that a contact hole CH, which connects the pixel circuit PC1 above a transmissive region TP and the pixel electrode PE to each other, is located in a position closer to the adjacent data line DL1 than the data line DL1 connected to the pixel circuit PC1. The contact hole CH may instead be disposed so that an image signal is supplied from a data line DL1 to the pixel circuit PC1 that overlaps the data line DL1.

Figure 21:
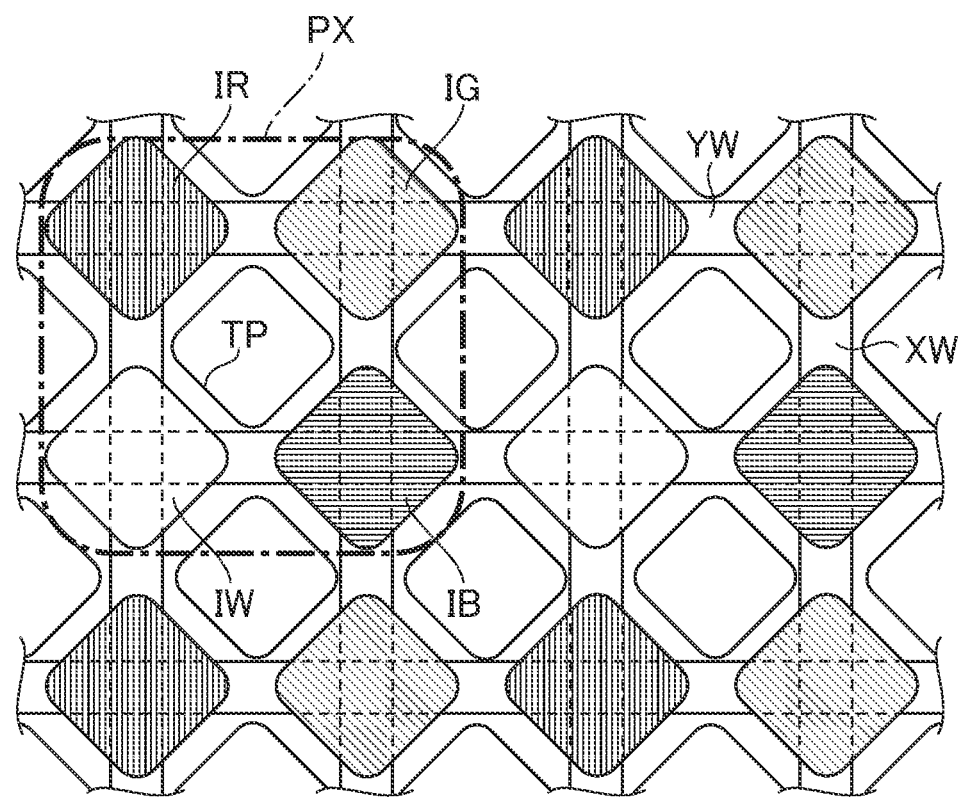
FIG. 21 is a diagram for illustrating another example of the arrangement of the light emitting sections and the transmissive regions.

FIG. 21 is a diagram for illustrating another example of the arrangement of the light emitting sections IR, IG, IB, and IW and the transmissive regions TP. The example shown in FIG. 21 differs from the example shown in FIG. 19 in that each of the light emitting sections IR, IG, IB, and IW has a rounded rectangular shape. The diagonal lines of the rectangle extend in the upward/downward direction and the rightward/leftward direction from the intersection and overlap a wiring line region XW and a wiring line region YW. Each of the transmissive regions TP is shaped so that the diagonals thereof extend in the upward/downward direction and the rightward/leftward direction not to intersect the light emitting sections IR, IG, IB, and IW. Looking at the light emitting sections IR, IG, IB, and IW from a different angle, each of the light emitting sections has a first portion extending in the rightward/leftward direction through the space between two pairs of transmissive regions TP adjacent to each other in the upward/downward direction, a second portion extending in the upward/downward direction through the space between two pairs of transmissive regions TP adjacent to each other in the rightward/leftward direction, and a third portion that connects the first portion and the second portion to each other. The third portion extends from the first portion in both the upward and downward directions and from the second portion in both the rightward and leftward directions. In this configuration, the area of each of the light emitting sections IR, IG, IB, and IW can be increased as compared with the example shown in FIG. 19, whereby the luminance of emitted light can be increased.

In the structure of each of the first to third embodiments described above, around a plurality of pixels PX including the transmissive regions TP arranged in a matrix may be disposed pixels which differ from the pixels PX and do not contribute to light emission and each of which is what is called a dummy pixel. Each of the dummy pixels may have the same structure as the structure of the pixels PX or may differ from the structure of the pixels PX. For example, no light emitting section may be disposed in a position of a wiring line group that surrounds the dummy pixel, or the shape and size of the transmissive regions may differ from those of the pixels PX.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate having a plurality of transmissive regions aligned in a first direction and a second direction that intersects the first direction;
a plurality of first wiring lines disposed on the substrate and running in the first direction;
a plurality of second wiring lines disposed on the substrate and running in the second direction; and
a plurality of light emitting sections disposed on the substrate,
wherein each of the transmissive regions is surrounded by the first wiring lines and the second wiring lines,
each of the light emitting sections is located at a center of four of the transmissive regions adjacent to each other in the first and second directions and continuously has a first portion running through spaces between two pairs of the transmissive regions adjacent to each other in the first direction and a second portion running through spaces between two pairs of the transmissive regions adjacent to each other in the second direction.

2. The display device according to claim 1, wherein each of the light emitting sections further has a third portion, and
the third portion runs from the first portion toward both sides in the first direction, runs from the second portion toward both sides in the second direction, and connects the first portion with the second portion.

3. The display device according to claim 1, further comprising:
an interlayer film provided between the plurality of light emitting sections and the substrate; and
a plurality of light-transmissive planarizing films provided in the plurality of transmissive regions,
wherein the interlayer film does not overlap the plurality of transmissive regions in plan view.

4. The display device according to claim 3, wherein the interlayer film has a side surface facing the planarizing film, and
each of the light emitting sections is provided so as to reach the side surface.

5. The display device according to claim 3, wherein the plurality of light emitting sections include at least a blue light emitting section that emits blue light,
each of the transmissive regions is adjacent to a first wiring line group including some of the first wiring lines and a second wiring line group including some of the second wiring lines,
one of the first wiring line group and the second wiring line group is wider than an other of the first wiring line group and the second wiring line group, and
the blue light emitting section overlaps the one of the first wiring line group and the second wiring line group in plan view.

6. The display device according to claim 3, wherein the plurality of light emitting sections include at least a blue light emitting section that emits blue light,
each of the transmissive regions is adjacent to a first wiring line group including some of the first wiring lines and a second wiring line group including some of the second wiring lines,
one of the first wiring line group and the second wiring line group is narrower than an other of the first wiring line group and the second wiring line group, and
the blue light emitting section overlaps the one of the first wiring line group and the second wiring line group in plan view.

* * * * *